(12) United States Patent
Link et al.

(10) Patent No.: US 9,985,607 B2
(45) Date of Patent: May 29, 2018

(54) MULTIPLEXER HAVING FEWER INTERMODULATION PRODUCTS

(71) Applicant: Snaptrack Inc., San Diego, CA (US)

(72) Inventors: Andreas Link, Laaber (DE); Gabriele Kolb, Munich (DE)

(73) Assignee: SnapTrack, Inc., San Diego, CA (US)

( * ) Notice: Subject to any disclaimer, the term of this patent is extended or adjusted under 35 U.S.C. 154(b) by 134 days.

(21) Appl. No.: 14/424,982

(22) PCT Filed: Jul. 30, 2013

(86) PCT No.: PCT/EP2013/066014
§ 371 (c)(1),
(2) Date: Feb. 27, 2015

(87) PCT Pub. No.: WO2014/032889
PCT Pub. Date: Mar. 6, 2014

(65) Prior Publication Data
US 2015/0236840 A1    Aug. 20, 2015

(30) Foreign Application Priority Data

Aug. 30, 2012  (DE) .................. 10 2012 108 030

(51) Int. Cl.
*H03H 9/70* (2006.01)
*H03H 9/72* (2006.01)
(Continued)

(52) U.S. Cl.
CPC ............ *H03H 9/706* (2013.01); *H03H 9/725* (2013.01); *H04B 15/00* (2013.01); *H04L 5/14* (2013.01)

(58) Field of Classification Search
CPC ........ H03H 9/706; H03H 9/725; H04B 15/00; H04L 5/14
(Continued)

(56) References Cited

U.S. PATENT DOCUMENTS

| 8,125,298 | B2 * | 2/2012 | Hara ................... | H03H 9/0571 333/133 |
| 2002/0089393 | A1 * | 7/2002 | Tikka ................. | H03H 9/0571 333/133 |

(Continued)

FOREIGN PATENT DOCUMENTS

| DE | 102005028927 A1 | 12/2006 |
| DE | 102006031548 A1 | 1/2008 |

(Continued)

OTHER PUBLICATIONS

Machine English Translation of Foreign Patent JP2011-193080 which was Published on Sep. 29, 2011.*

(Continued)

*Primary Examiner* — Robert J Pascal
*Assistant Examiner* — Jorge Salazar, Jr.
(74) *Attorney, Agent, or Firm* — Patterson & Sheridan, L.L.P.

(57) ABSTRACT

A multiplexer (MUL) having fewer intermodulation products is specified. For this purpose, the multiplexer (MUL) comprises a transmit and/or receive filter (Tx, Rx), which operates with acoustic waves, and blocker electrodes (EL1, EL2) for diverting undesired frequency components to ground (GND). The blocker electrodes (EL1, EL2) are arranged in this case on the same chip (CH) as the filter which operates with acoustic waves.

28 Claims, 11 Drawing Sheets

(51) Int. Cl.
*H04L 5/14* (2006.01)
*H04B 15/00* (2006.01)

(58) Field of Classification Search
USPC .................................. 333/133; 455/78, 83
See application file for complete search history.

(56) References Cited

U.S. PATENT DOCUMENTS

| | | | |
|---|---|---|---|
| 2004/0130410 A1 | 7/2004 | Nishimura et al. | |
| 2006/0091977 A1 | 5/2006 | Inoue et al. | |
| 2008/0007369 A1* | 1/2008 | Barber | H03H 9/02086 333/189 |
| 2008/0024243 A1 | 1/2008 | Iwaki et al. | |
| 2008/0068109 A1 | 3/2008 | Schmidhammer | |
| 2008/0290969 A1 | 11/2008 | Yamakawa et al. | |
| 2009/0128260 A1* | 5/2009 | Block | H03H 9/6423 333/187 |
| 2009/0174497 A1* | 7/2009 | Korden | H03H 9/0571 333/100 |
| 2009/0315640 A1* | 12/2009 | Umeda | H03H 9/0028 333/133 |
| 2010/0109801 A1* | 5/2010 | Inoue | H03H 9/547 333/133 |
| 2011/0210805 A1* | 9/2011 | Link | H03H 9/547 333/134 |
| 2012/0293277 A1* | 11/2012 | Hara | H03H 9/0576 333/133 |
| 2013/0147678 A1 | 6/2013 | Taniguchi | |
| 2014/0218128 A1* | 8/2014 | Fujita | H03H 9/6489 333/133 |

FOREIGN PATENT DOCUMENTS

| | | |
|---|---|---|
| DE | 10296803 B4 | 4/2008 |
| EP | 1276245 A1 | 1/2003 |
| EP | 1653615 A1 | 5/2006 |
| EP | 1758247 A2 | 2/2007 |
| JP | 2001285123 A | 10/2001 |
| JP | 2002344349 A | 11/2002 |
| JP | 2006135447 A | 5/2006 |
| JP | 2007060411 A | 3/2007 |
| JP | 2007336479 A | 12/2007 |
| JP | 2010045563 A | 2/2010 |
| JP | 2011-193080 | 9/2011 |
| JP | 2011211347 A | 10/2011 |
| JP | 2012147175 A | 8/2012 |
| WO | WO-2007000929 A1 | 1/2007 |
| WO | WO-2012020595 A1 | 2/2012 |
| WO | WO-2013061694 A1 | 5/2013 |

OTHER PUBLICATIONS

Nishihara, T. et al.: "BAW/SAW/IPD hybrid type duplexer with Rx balanced output for WCDMA Band I", Microwave Symposium Digest, 2008 IEEE MTT-S International, IEE, Piscataway, NJ, USA, Jun. 15, 2008, pp. 831-834, ISBN: 978-1-4244-1780-3.

International Search Report and Written Opinion—PCT/EP2013/066014—ISA/EPO—dated Oct. 23, 2013.

* cited by examiner

MULTIPLEXER HAVING FEWER INTERMODULATION PRODUCTS

FIELD OF INVENTION

The invention relates to multiplexers having fewer intermodulation products, in particular multiplexers in which frequency components which can result in undesired intermodulation effects are suppressed or eliminated.

BACKGROUND

Intermodulation products or intermodulation distortions (IMD) occur in nonlinear systems and therefore in real technical systems when two or more signals of different frequencies are processed. It can thus occur that during mixing on a nonlinear circuit element, products of the two signals are generated. In the case of two signals of the form $$U_1(t) = A_1 \cos(\omega_1 t)$$

and $$U_2(t) = A_2 \cos(\omega_2 t)$$

a plurality of frequency components $m\omega_1 +/- n\omega_2$ result with m, n=0, 1, 2, . . . , wherein the sum m+n specifies the order. If a resulting frequency component is a multiple of a fundamental tone $\omega_1$ or $\omega_2$, this is referred to as a harmonic. If it is the total of multiples of the two fundamental tones, it is referred to as an intermodulation product.

In multiplexers and especially in duplexers, those intermodulation products are problematic which arise at an antenna input and are located in the Rx band or in the vicinity of the Rx band. They "block" the Rx signal path, since they cannot simply be filtered out by filtering measures. Otherwise, the Rx useful frequency would also be destroyed. Such undesired intermodulation products can arise in particular in duplexers due to the multiplication of Tx signals with a blocker signal received externally via the antenna. The Rx passband associated with a Tx signal is relatively close, usually above the Tx passband, in the case of a duplexer. Therefore, harmonics of the Tx signal do not fall, but intermodulation products of the Tx signal and an externally received signal do fall in its own Rx passband.

In comparison to harmonics which can be removed by high-pass filters or local poles in the stopband of a transmit filter, a way other than filtering out must therefore be selected.

Providing BAW resonators, which are connected in anti-parallel to one another, to reduce nonlinear effects is known from DE 10 2005 028 927 A1.

This has the disadvantage that space on the surface of a costly chip must be provided for the additional resonators.

SUMMARY OF INVENTION

It is therefore one object of the present invention to specify a multiplexer having fewer intermodulation effects, which meets current miniaturization requirements, does not restrict the power compatibility, in which the slope of the filter flanks is not reduced, and which is suitable for mass production. In particular, it is an object of the present invention to specify a multiplexer, in which blocker frequencies are already eliminated at antenna nodes themselves or in the circuit region close to the antenna. Furthermore, the multiplexer is to be produced cost-effectively and is to have measures for reducing intermodulation effects, which may be combined easily with measures for reducing intermodulation effects because of other blocker frequencies. Furthermore, it is an object to specify an improved multiplexer, in which no additional manufacturing steps are necessary during the production and in which additional external circuit elements are not absolutely necessary. Furthermore, the multiplexer is to be compatible with other measures for reducing intermodulation effects. Furthermore, the electrical properties of the multiplexer are not to be worsened by the measures for reducing the intermodulation effects.

These objects are achieved by a multiplexer as described herein. Embodiments of the multiplexer as described herein provides advantages over conventional devices The invention comprises a multiplexer which operates with acoustic waves, having a transmit terminal, a receive terminal, and a common terminal. The multiplexer furthermore comprises a transmit path, which is interconnected between the transmit terminal and the common terminal and comprises a transmit filter, and a receive path, which is connected between the receive terminal and the common terminal and comprises a receive filter. Furthermore, the multiplexer contains a chip and a blocker path, which is interconnected with the common terminal. The blocker path comprises blocker electrodes arranged on the chip in this case, which are provided to divert blocker signals to ground. In this case, blocker signals are those signals which, when multiplied with other signals propagating in the multiplexer, result in intermodulation products, which can lie in particular in an Rx frequency range and therefore block the Rx path. Accordingly, blocker electrodes are those electrodes which are designed accordingly to divert the blocker signals to ground.

A multiplexer is thus specified, in which blocker signals are diverted accordingly via suitable measures, so that mixing with signals occurring regularly in multiplexers does not occur at all in the ideal case and therefore intermodulation products are also not generated.

The multiplexer operates with acoustic waves. For example, surface acoustic waves (SAW), bulk acoustic waves (BAW), or guided bulk acoustic waves (GBAW) come into consideration. In each of these cases, electrode structures are used in conjunction with a piezoelectric material for conversion, because of the piezoelectric effect, between acoustic vibrations and electrical high-frequency signals. Multiplexers operating with acoustic waves thus have electrodes, which are arranged in the form of structured electrode fingers on a piezoelectric substrate (in the case of surface acoustic waves or guided surface acoustic waves) or which enclose a piezoelectric layer like a sandwich and are implemented in a large area. In the case of surface acoustic waves or guided surface acoustic waves, the chip comprises the piezoelectric material in this case. In the case of bulk acoustic waves, the sandwich structure made of electrodes and piezoelectric material is arranged, possibly together with mirror layers, on a carrier chip. The provision of blocker electrodes to divert blocker signals to ground is therefore compatible with conventional production processes for multiplexers operating with acoustic waves.

Therefore, the blocker electrodes may easily be combined with the circuit elements of the multiplexers and the object of the invention is achieved in a simple but effective manner.

The term multiplexer relates in this case to a crossover having at least one common terminal, which can be an antenna terminal, and a number of m Tx signal paths and n Rx signal paths, wherein m and n are natural numbers ≥1. In particular, it is possible that the multiplexer is a duplexer having a Tx path and an Rx path.

The blocker electrodes can be electrodes of an acoustically active filter element. An active blocker element can thus, solely by way of its electrical effect, for example, as a capacitive element, suppress or reduce blocker signals in a first frequency range and, by way of its electroacoustic effect, suppress or reduce blocker signals in a second frequency range, which is different from the first frequency range. It is also possible that the blocker element is designed so that its solely electrical effect and its electroacoustic effect work together and suppress blocker signals of a single frequency range still better.

In one embodiment, the blocker path comprises circuit elements of the transmit filter or the receive filter.

In particular interdigital structures in the form of interdigital converters or BAW resonators, which are constructed like sandwiches, come into consideration as the circuit elements of the transmit filter or the receive filter, which simultaneously comprise blocker electrodes of the blocker path. Because these structures are designed accordingly, they can simultaneously be used as elements of the transmit path or the receive path, on the one hand, and can represent circuit elements, via which blocker signals can be diverted to ground, on the other hand.

In one embodiment, the multiplexer comprises one or more resonators, which operate with acoustic waves, having blocker electrodes in one or more blocker paths, wherein each blocker path or each resonator, which operates with acoustic waves, having blocker electrodes is provided to divert two blocker frequencies.

In one embodiment, the multiplexer comprises one or more further transmit paths each having a further transmit filter and one or more receive paths each having a further receive filter. Thus, in addition to a duplexer, triplexers, quadruplexers, etc. can also be obtained easily.

In one embodiment, the transmit filter and/or the receive filter operates with surface acoustic waves, with bulk acoustic waves, or with guided bulk acoustic waves.

It is also possible that the transmit filter operates with one of the specified types of acoustic waves, while the receive filter operates with another type of acoustic waves. It is then possible that the transmit filter or the electrode structures of the transmit filter are arranged on a first chip and the receive filter or the receive filter electrodes are arranged on a further chip. The blocker electrodes can be arranged in this case on the first chip and/or on the further chip. It is also possible that some circuit elements of the blocker path are arranged on one chip, while other circuit elements of the blocker path are arranged on the further chip. The circuit elements of the blocker path can also operate in this case with different types of acoustic waves.

In one embodiment, the transmit filter comprises BAW resonators and the receive filter comprises SAW resonators. The BAW resonators and the SAW resonators are arranged on or in various chips. Therefore, a multiple die multiplexer is obtained, in which the different filter technologies ensure the different requirements for transmit and receive filters, for example, with regard to the power-handling capacity, selection, insulation, etc.

In one embodiment, however, the chip comprises all circuit elements of the transmit filter and/or the receive filter. The multiplexer then operates with only one type of acoustic waves, wherein then the circuit elements of the blocker path can also be arranged on the chip.

In one embodiment, the blocker path comprises an electroacoustic resonator, which is arranged on the chip.

The electroacoustic resonator of the blocker path can be in this case a series or parallel branch resonator of the transmit filter or the receive filter. The blocker path can comprise two or more electroacoustic resonators. The blocker path can thus comprise, for example, a series circuit of a resonator in the series branch, followed by a further parallel branch.

Transmit or receive filters can comprise series and parallel branch resonators interconnected in a ladder-type structure, wherein the ladder-type structure represents a band-pass filter as a whole. Only a part of the respective filter can also be embodied as a ladder-type structure, while remaining filter elements comprise alternative topologies, for example, DMS (dual-mode SAW) structures.

The use of a parallel branch resonator, a transmit filter, or a receive filter as a circuit element which comprises blocker electrodes of the blocker path suggests itself in this case, since parallel branch resonators, for example, in ladder-type circuits, interconnect the signal path with ground. A ground path is thus provided which interconnects the common terminal with ground and via which blocker signals can be diverted to ground.

In one embodiment, the blocker path comprises an inductive element, which is embodied as a metallization in the transmit filter or in the receive filter on the chip.

It is also possible that the inductive element is embodied as a metallization in a multilayer substrate, on which the chip is arranged. Furthermore, it is possible that the inductive element is embodied as a discrete element on a module, which contains the chip, or as a discrete element on a circuit board, which is interconnected with the chip.

Therefore, the blocker path comprises blocker electrodes which represent a capacitive element and an inductive element. The capacitive element and the inductive element can be interconnected in series or in parallel and therefore can represent a resonant circuit. The resonance frequency of the resonant circuit can be set in this case so that its resonance frequency corresponds to the frequency of blocker signals which are considered to be particularly interfering.

Very generally, the capacitance of the capacitive element can be set for this purpose by setting the area of BAW electrodes or the aperture and the transducer length or the number of fingers of interdigital structures. Furthermore, it is essentially also possible to provide the spacing of the electrodes suitably to set the capacitance.

The spacing of the electrode structures essentially determines the wavelength of the acoustic waves, with which the multiplexer operates. It is possible in this case that acoustically active electrode structures are used as blocker electrodes in the blocker path. However, it is also possible that electrode structures which are acoustically inactive in the relevant frequency range are used. The spacing and the area of the blocker electrodes can then be selected essentially arbitrarily to set the capacitance of the capacitive element.

The inductance of the inductive element can be set by the length of the conductor sections of the inductive element. Furthermore, it is possible to provide windings, wherein the number of windings can be set to set the inductance of the inductive element. Overall, many possibilities can thus be chosen to set the capacitance of the capacitive element or the inductance of the inductive element, to obtain good diversion of the blocker signals to ground.

In one embodiment, the inductive element has a low inductance. The inductive element can thus be formed solely by a feed line, wherein the inductance of the inductive element is then the parasitic inductance of the feed line. If a low inductance is desired, the inductance is thus obtained as an intrinsic inductance of a feed line provided in any case, wherein space is saved and a multiplexer component having a small structure is obtained.

In one embodiment, the transmit filter and/or the receive filter has/have BAW resonators. The blocker path has a BAW resonator, the mass coating of which deviates from the mass coating of the resonators of the transmit filter and/or the mass coating of the resonators of the receive filter.

A capacitive element is thus obtained in the blocker path, in which the electrical and/or acoustic properties of the blocker electrodes are optimized to divert blocker signals to ground. Furthermore, a means is thus specified to advantageously set the acoustic properties.

In one embodiment, the blocker path has a BAW resonator, which has more or fewer layers than a resonator of the transmit filter or the receive filter. The resonance frequency is thus strongly shifted and an advantageous capacitive behavior is obtained in the frequency range of the passbands.

In one embodiment, the blocker path (BP) has a BAW resonator (R), in which one or more layers is/are different in thickness in relation to a BAW resonator of the transmit filter (Tx) or receive filter (Rx).

In one embodiment, the blocker path has a BAW resonator, wherein a physical property of a layer is changed in comparison to the physical properties of corresponding layers of resonators of the transmit filter and/or receive filter. Changing physical properties, for example, the mass coating, the thickness, the number of the layers, the acoustic impedance, or the electrical conductivity, represents a simple possibility for obtaining a BAW resonator, which is not only part of the transmit filter and/or receive filter, but rather is also part of the blocker path and therefore must meet additional requirements.

In one embodiment, the blocker path comprises a BAW resonator, the operating frequency of which is changed by changes in geometry in comparison to BAW resonators of the transmit filter and/or receive filter.

In addition to the above-mentioned properties, changes in geometry, for example, a changed footprint of the resonator, can also be used to obtain a resonator optimized toward multiple requirements.

A changed geometry in the case of multiplexers operating with surface acoustic waves is possible, for example, by way of a changed metallization height, a change of the pitch, i.e., a change of the spacing of finger electrode center to finger electrode center, or a change of the metallization ratio η.

The resonance behavior of a resonator is not arbitrarily narrowband. Therefore, a positive effect is already achieved, even if the resonance frequency of the resonant circuit—for example, the blocker resonator alone or a series circuit of blocker resonator and inductive element—is only in the vicinity of the blocker band with regard to frequency. The resonance frequency of a resonant circuit having a capacitance C and an inductance L is at $$\Omega = \frac{1}{\sqrt{LC}}.$$

The inductance of the inductive element and the capacitance of the capacitive element can be selected accordingly, to divert blocker frequencies to ground.

In one embodiment, the blocker path comprises a capacitive element, which is acoustically inactive. Such an acoustically inactive element can be a capacitive element, which is only inactive in corresponding frequency ranges, for example, Tx frequency range or Rx frequency range, or which does not interact with acoustic waves at all. For this purpose, it is possible, for example, to arrange a non-piezoelectric material instead of a piezoelectric material between BAW electrodes. It is also possible to use conductive material from mirror layers of a BAW resonator, for example, from the electrode material of the actual BAW electrodes, as the electrodes for capacitive elements which are essentially acoustically inactive. In addition, it is possible to interconnect one of the actual BAW electrodes and a conductive mirror layer with an intermediate layer of oxide to form a capacitive element.

In one embodiment, the multiplexer thus comprises a BAW resonator having blocker electrodes, wherein at least one of the BAW electrodes and/or a mirror layer comprising a conductive material represents a blocker electrode.

Furthermore, it is possible, in the case of electrode structures operating with surface acoustic waves or guided bulk acoustic waves, to pivot the alignment of the finger electrodes in relation to possible propagation directions of acoustic waves, so that the electroacoustic coupling coefficient $\kappa^2$ disappears. Such capacitive elements solely have a capacitive effect, so that their physical dimensions can be selected such that no negative electroacoustic interaction occurs with Tx or Rx signals.

In one embodiment, the multiplexer comprises two or more blocker paths having blocker electrodes arranged on the chip, which are provided for diverting blocker signals to ground.

It is also possible to distribute various parts of one or more blocker paths onto various chips, if the multiplexer comprises multiple chips.

Thus, multiple blocker paths can be provided, wherein each blocker path is provided for diverting a respective different blocker signal to ground. Thus, a variety of blocker frequencies can be made harmless, without intermodulation with Tx signals taking place.

In one embodiment, the multiplexer comprises a transmit filter and a receive filter. The multiplexer furthermore comprises a first blocker path, which is interconnected with a node arranged between the transmit filter and the common terminal, and a second blocker path, which is interconnected with a node arranged between the receive filter and the common terminal.

Furthermore, it is possible that a filter has two, three, four, or more blocker paths.

Thus, intermodulations between various blocker frequencies and, on the one hand, Tx signals from the transmit filter and, on the other hand, signals which are reflected from the receive filter to the common terminal or to the transmit filter, can be eliminated easily.

In one embodiment, the multiplexer comprises precisely one transmit filter and precisely one receive filter and thus represents a duplexer.

If the total of the frequencies of the Tx signal and the blocker signal essentially corresponds to the frequency of the Rx signals, for example, in the WCDMA band 2 having Tx frequencies between 1880 MHz and 1910 MHz and Rx frequencies between 1930 MHz and 1990 MHz at blocker frequencies around 20 MHz and 140 MHz, second-order intermodulation products would lie in the Rx frequency range. In such a situation, it is particularly advantageous if blocker signals are eliminated in this simple manner so that intermodulation products do not arise at all.

The diversion of blocker signals is accordingly also advantageous if the absolute value of the difference of Tx signals and blocker signals corresponds to the frequency of the Rx signals. This is the case, for example, with blocker signals of the frequencies 3760 MHz and 3900 MHz.

Furthermore, the situation, when the absolute value of the difference of two times the Tx frequency and blocker frequency corresponds to the Rx frequency, is of practical significance. This is the case, for example, with blocker frequencies around 1770 MHz and 1890 MHz and between 5630 MHz and 5810 MHz.

In one embodiment, resonators of the transmit filter and/or the receive filter are embodied as doubled, wherein the resonators which are doubled in each case are connected in antiparallel, to reduce nonlinear effects.

In the case of the serial doubling, in this case one resonator is replaced by two resonators connected one after another of doubled area in each case, so that the total impedance of the doubled resonators corresponds to the impedance of the replaced resonator. In the case of parallel doubling, one resonator is replaced by two resonators connected in parallel of half the area, to obtain the same impedance of the replaced resonators. For this purpose, it is possible with the aid of through contacts (vias) or bump connections to interconnect an upper electrode of one resonator and the lower electrode of the corresponding other resonator at a node point.

In one embodiment, the common terminal is connected to ground via an inductive element, so that an ESD protection is obtained. In this case, the inductive element diverts ESD signals received through the common terminal, for example, an antenna, directly to ground, so that the transmit filter and in particular the sensitive receive filter is protected from the broadband ESD signal.

It is also possible that the ESD protective path has, in addition to the inductive element, a capacitive element connected in series to the inductive element.

In one embodiment, the transmit path between the transmit filter and the common terminal comprises an impedance adaptation network. It is also possible that an impedance adaptation network is arranged between the common terminal and the receive filter.

In one embodiment, the transmit filter of the multiplexer or the receive filter of the multiplexer comprises a band-pass filter or a band-stop filter. Band-pass filter and band-stop filter can both be manufactured in SAW or BAW technology and therefore the corresponding resonators can be arranged on the chip.

In one embodiment, the multiplexer comprises one or multiple stop circuits for blocker frequencies, wherein the one stop circuit or the multiple stop circuits are arranged between an antenna and the common terminal CC.

In one embodiment, the multiplexer comprises a stop circuit between the common terminal CC and a filter in the receive or transmit path.

An acoustically active element can be interconnected in a stop circuit.

In one embodiment, the multiplexer comprises a transmit path having a band-stop filter, which is non-transmissive for blocker frequencies in relation to a receive path. It is possible that the transmit filter of the transmit path exclusively consists of the band-stop filter. A band-stop filter can be a notch filter, for example, the stop band of which is in the range of the receive band of a receive path. The notch filter can comprise electroacoustic resonators and inductive and/or capacitive circuit elements. Such a notch filter is represented by a so-called extractor filter and is suitable for interconnection with receive paths for satellite-assisted systems such as GPS, Glonass, Compass, or Galileo.

In one embodiment, the multiplexer is contained in a mobile communication device having a further filter or multiplexer and having two antennas. The multiplexer diverts blocker signals to ground, which are coupled from one antenna into the other antenna. Such a multiplexer is therefore suitable for mobile communication devices having diversity functionality. A transmit signal of the multiplexer can be coupled from an antenna interconnected with the multiplexer into a further diversity antenna together with an external blocker signal. This can result in undesired intermodulation products in a further multiplexer, which is interconnected with the further diversity antenna. To prevent this, it is possible that the multiplexer or further multiplexers have blocker paths, which divert the blocker signals in relation to respective other multiplexers to ground. Such blocker paths can be provided in the multiplexer or in further multiplexers.

In one embodiment, the mobile communication device comprises a receive filter for GPS, Glonass, Galileo, or Compass signals as a further filter.

In one embodiment, the further filter is a bidirectional single filter, which can be provided, for example, for the fields of application of Bluetooth or WLAN.

In one embodiment of the multiplexer, the multiplexer is interconnected in a mobile communication device with a further filter or multiplexer. The multiplexer is provided for diverting to ground blocker signals, which would be coupled via an antenna interconnected with the multiplexer into an antenna of the communication device, which is interconnected with another signal path. The multiplexer thus ensures that blocker signals which would result in disturbances in other multiplexers are diverted to ground.

In one embodiment, the multiplexer is interconnected in a mobile communication device, wherein the mobile communication device comprises a further filter or a further multiplexer. The multiplexer is then provided to divert to ground blocker signals, which would be coupled by crosstalk into another signal path of the communication device. In addition to the above-mentioned possibility that blocker signals can arrive via antennas in other signal paths of a communication device without correspondingly designed blocker paths, a possibility is now provided for neutralizing blocker signals which would be coupled inside the mobile communication device by crosstalk into other signal paths.

In one embodiment of the multiplexer, the signal paths for separation by high-pass, low-pass, band-pass, or band-stop filters are interconnected with an antenna node.

In one embodiment, the multiplexer comprises a further filter, which can be the above-mentioned further filter or a second further filter. The further filter is a receive filter for GPS, Glonass, Galileo, or Compass signals.

In one embodiment, the band-stop filter is a bidirectional single filter.

In one embodiment, a further filter or a further multiplexer follows the band-stop filter on the side facing away from the antenna.

In one embodiment, the multiplexer is interconnected in a communication device having one or more further multiplexers and two or more associated antennas.

In one embodiment, the multiplexer diverts blocker signals from outside and/or signals because of direct crosstalk between the antennas from other multiplexers. In particular, those signals are diverted which, if they were not diverted, would generate interfering intermodulation products together or with its own transmit signals.

In one embodiment, the multiplexer diverts blocker signals from outside and/or signals because of direct crosstalk in its own device, which can originate from other multiplexers of the device. These signals would, if they were not diverted, generate interfering intermodulation products together or with its own transmit signals.

In one embodiment, the multiplexer comprises one or more blocker paths for eliminating those intermodulation products which do not interfere in its own multiplexer, but, if emitted via its own antenna, could be coupled into one of the other antennas and could cause interference therein in connected multiplexers.

In one embodiment, the multiplexer comprises one or more blocker paths for eliminating intermodulation products, which do not interfere in its own multiplexer, but would interfere due to direct crosstalk in the device in other multiplexers.

In one embodiment, a lower-order high-pass, low-pass, band-pass, or band-stop filter is connected upstream on the antenna side from at least one transmit or receive filter in the transmit or receive paths.

In one embodiment of this multiplexer, at least one or multiple or all of the lower-order high-pass, low-pass, band-pass, or band-stop filters is constructed from capacitive and/or inductive elements.

In one embodiment, only the lower-order filter with one or more blocker paths is contained in at least one signal path.

In one embodiment of the multiplexer, only the lower-order filter with blocker paths is contained in at least one signal path.

In one embodiment, the multiplexer is a diplexer, triplexer, quadplexer, or quintplexer, or a higher-value multiplexer.

The multiplexer will be explained in greater detail hereafter on the basis of exemplary embodiments and schematic figures.

DETAILED DESCRIPTION

Figure 1A:
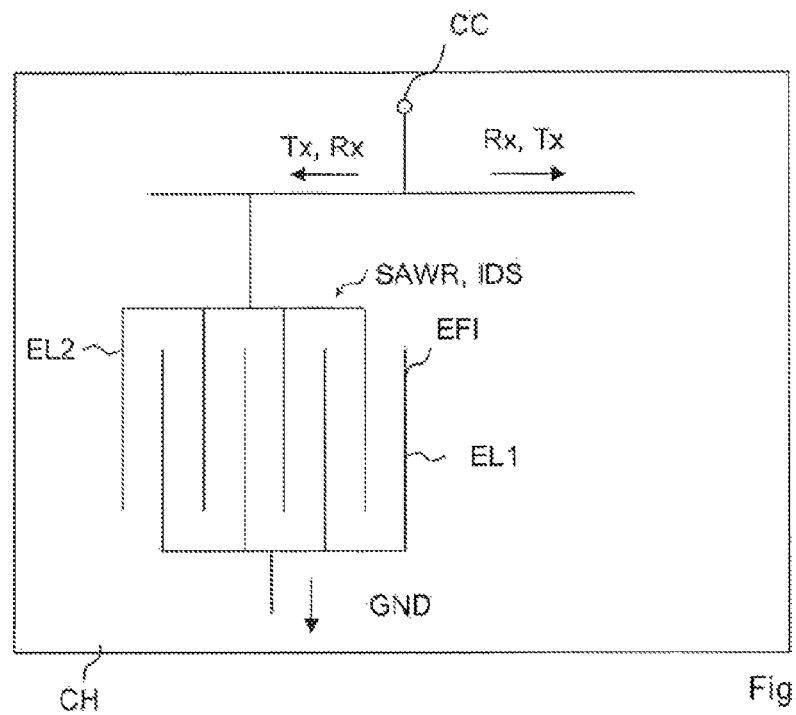
FIG. 1A shows a chip surface having finger electrodes arranged thereon of an interdigital transducer.

FIG. 1A shows the arrangement of interdigital structures on a chip surface. Interdigital structures IDS, which comprise electrode fingers EFI, of an SAW resonator SAWR are arranged on the surface of the chip CH. These interdigital structures interconnect a common terminal CC of a duplexer with ground GND. In this case, the SAW resonator SAWR can be interconnected with a transmit-filter-side signal path (Tx) or receive-side signal path (Rx) of the duplexer or directly to the common terminal CC. The interdigital structure IDS of the SAW resonator SAWR can be acoustically active or acoustically inactive in the operating range of the duplexer in this case. Independently of the acoustic activity, such an interdigital structure represents a capacitive element, which can divert blocker signals to ground in the blocker path, so that intermodulation products mixed from blocker signals and Tx or Rx signals propagating in the duplexer do not arise.

The duplexer can operate with surface acoustic waves. It then comprises further SAW resonators and the interdigital structures IDS of the blocker path may be arranged without great effort and without additional work steps on the chip CH. The chip CH can be in this case a piezoelectric crystal, for example, made of $LiTaO_3$ (lithium tantalate) or $LiNbO_3$ (lithium niobate).

Figure 1B:
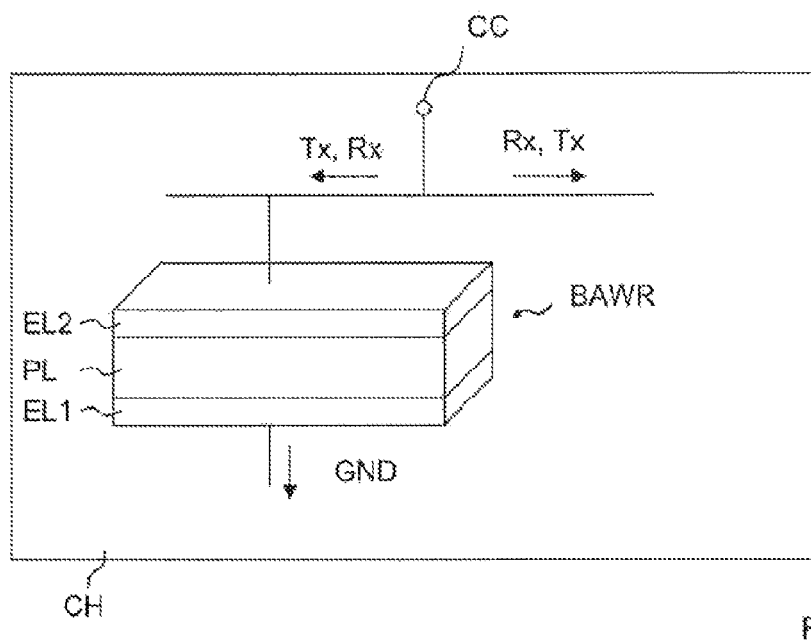
FIG. 1B shows a chip surface having a BAW resonator arranged thereon.

FIG. 1B shows the arrangement of a BAW resonator BAWR as a part of the blocker path and its arrangement on a surface of a chip CH. Similarly to the circuit of FIG. 1A, the BAW resonator can be interconnected directly with the common terminal CC or with a transmit-side (Tx) or receive-side (Rx) section of a signal path. The BAW resonator BAWR comprises a first, lower electrode EL1 and a second, upper electrode EL2. An insulating layer PL, which can be a piezoelectric layer and can comprise AlN (aluminum nitride) or ZnO (zinc oxide), is arranged between the two electrodes. The electrodes EL1 and EL2 represent in this case the blocker electrodes, via which blocker signals can be diverted to ground. If the multiplexer operates with bulk acoustic waves, corresponding BAW resonators are thus arranged on the chip CH during the production of the duplexer. The arrangement of a further BAW resonator BAWR for the blocker path or the provision of a BAW resonator of the transmit or receive filter, which simultaneously comprises the blocker electrodes for the blocker path, does not represent additional effort during the production of the multiplexer in this case.

The layer stack of the BAW resonator BAWR can be acoustically active or acoustically inactive. In each case, it represents a capacitive element, via which blocker signals can be diverted to ground.

Figure 2A:
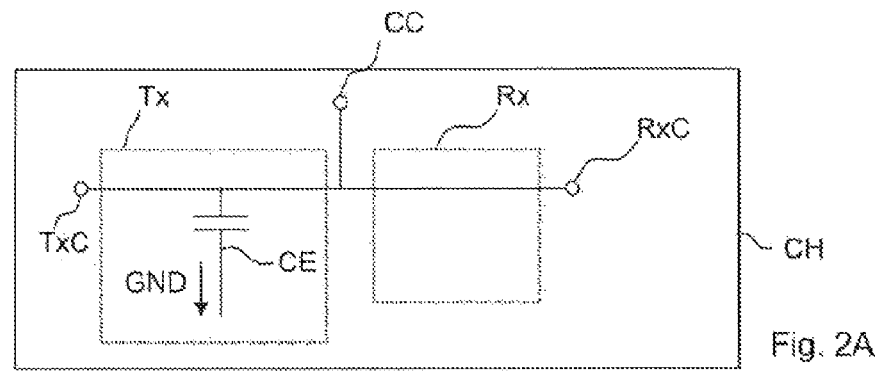
FIG. 2A shows a multiplexer having a capacitive element in a transmit filter.

FIG. 2A shows an embodiment of a multiplexer having a Tx filter Tx and an Rx filter Rx, wherein the Tx filter Tx is arranged between a Tx terminal TxC and a common terminal CC and the Rx filter Rx is arranged between a receive terminal RxC and the common terminal CC. A capacitive element CE, which comprises the blocker electrodes of the blocker path, is arranged in the transmit filter Tx and can divert blocker signals via ground to reduce or prevent intermodulation products.

Figure 2B:
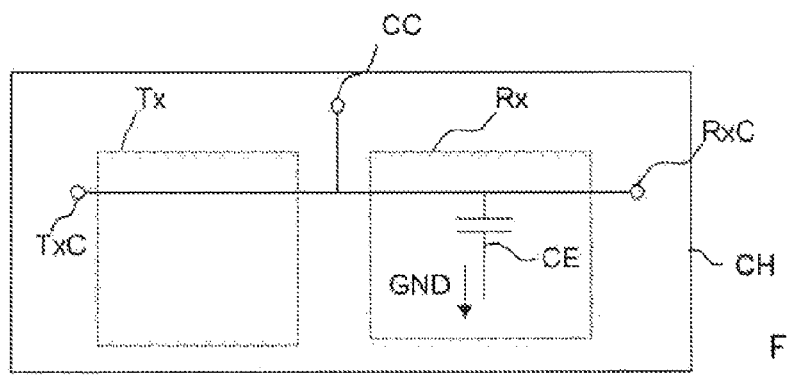
FIG. 2B shows a multiplexer having a capacitive element in a receive filter.

FIG. 2B shows an embodiment of a multiplexer, wherein a capacitive element CE, which comprises the blocker electrodes, is arranged in the receive filter Rx.

Figure 2C:
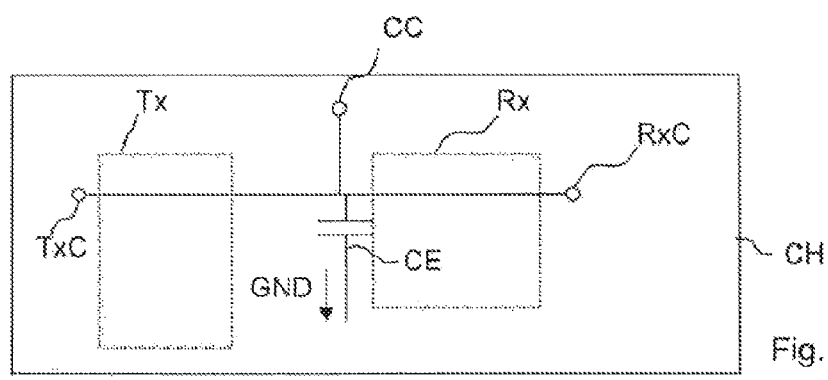
FIG. 2C shows a multiplexer, in which a common terminal is connected to ground via a capacitive element.

FIG. 2C shows an embodiment of a multiplexer, wherein a capacitive element CE, which comprises the blocker electrodes of the blocker path, is interconnected directly with the common terminal CC. The capacitive element CE is neither part of the transmit filter Tx nor of the receive filter Rx in this case. However, the capacitive element CE can be arranged on the same chip as the transmit filter Tx or the receive filter Rx.

Figure 3:
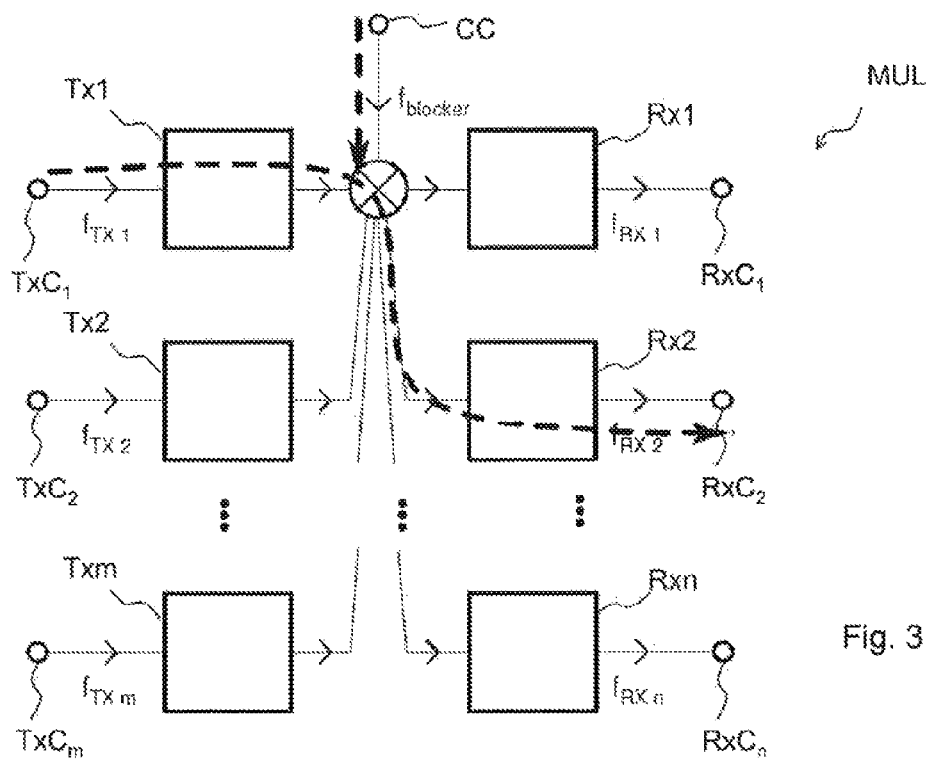
FIG. 3 shows a multiplexer and typical signal paths of intermodulation products.

FIG. 3 shows a multiplexer having m transmit signal paths Tx1, Tx2, . . . , Txm and m transmit filters Tx1, Tx2, . . . , Txm and n receive signal paths having n receive filters Rx1, Rx2, . . . , Rxn. The first, second, or mth transmit filter is arranged in this case between the first, second, or mth transmit terminal, on the one hand, and the common terminal CC, on the other hand. The first, second, nth receive filter Rx1, Rx2, Rxn is accordingly arranged in this case between the first, second, or nth receive terminal RxC1, RxC2, RxCn, on the one hand, and the common terminal CC, on the other hand. FRx1, FRx2, . . . , FRxn are in this case the receive frequencies, FTx1, FTx2, . . . , FTxm are the transmit frequencies.

It is shown as an example how transmit signals of the first transmit signal path from the first transmit filter Tx1 are mixed together with, inter alia, undesired but unavoidable blocker signals of the frequency $f_{blocker}$ of the common terminal CC and in this case frequency components arise for which the second receive filter Rx2 is transmissive. Such intermodulation products can pass the second receive filter Rx2 and would block the functional capability of the second Rx filter in conventional multiplexers. The transmissivity of the second receive filter Rx2 cannot be arbitrarily reduced here, since otherwise desired signals to be received of the same frequency range also could not pass the second receive filter Rx2.

The central idea of the invention is accordingly to divert blocker signals of the frequency $F_{blocker}$ via the blocker path to ground so that mixing with the transmit signals from the first receive filter Tx1 is suppressed in the ideal case but at least significantly attenuated.

Specifically, the second receive filter Rx2 can then maintain its high transmissivity for the corresponding frequencies $f_{Rx2}$, whereby undisturbed reception of corresponding signals is possible.

This is only one exemplary embodiment of a multiplexer. It is also possible to obtain a multiplexer in which duplexers, triplexers, etc. are embodied as cascaded.

Figure 4:
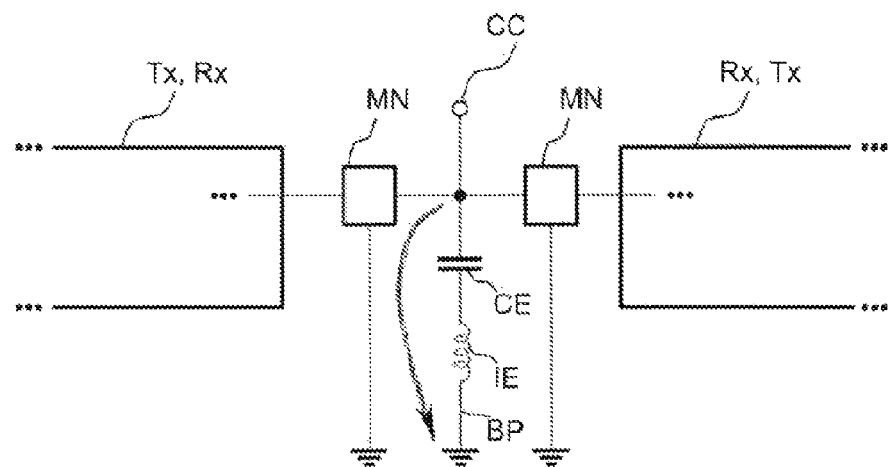
FIG. 4 shows a multiplexer having a series resonant circuit in a blocker path.

FIG. 4 shows an embodiment of a multiplexer, wherein the blocker path BP comprises a capacitive element CE and an inductive element IE, which are connected in series. The blocker path is interconnected directly with the common terminal CC in this case. It is possible, but not absolutely necessary, that an adaptation network MN is arranged between the transmit filter Tx and the common terminal CC. It is furthermore possible, but not absolutely necessary, that a further adaptation network MN is arranged between the receive filter Rx and the common terminal CC. The capacitive element CE of the blocker path BP comprises in this case the blocker electrodes, which are arranged together with electrodes of the resonators of the transmit filter or the receive filter.

The capacitive element CE can be an acoustically active element or an acoustically inactive element in this case.

Figure 5:
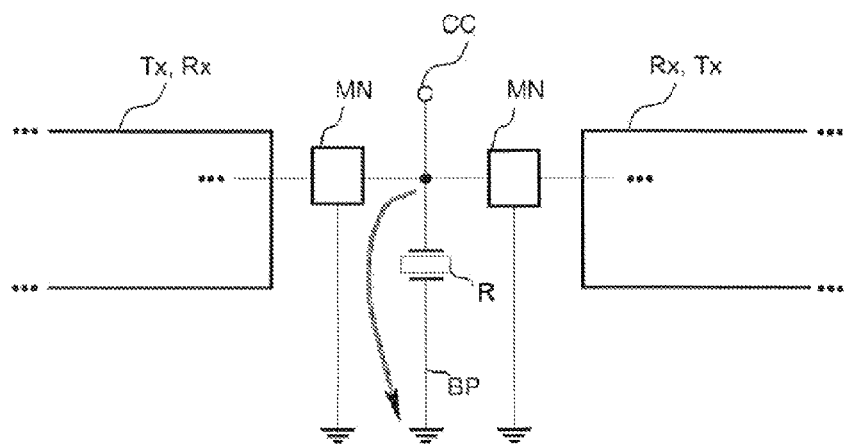
FIG. 5 shows a multiplexer having an electroacoustic resonator in a blocker path.

FIG. 5 shows an embodiment of a multiplexer in which the blocker electrodes are part of a resonator structure R. The resonator structure R can be acoustically active or inactive in this case.

Figure 6:
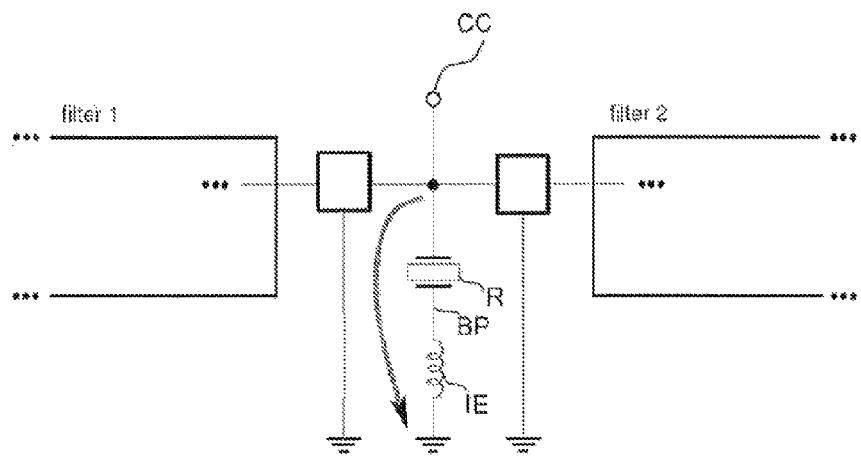
FIG. 6 shows a multiplexer having an acoustic resonator and an inductive element in a blocker path.

FIG. 6 shows an embodiment of a duplexer, wherein the blocker electrodes of the blocker path BP are arranged in a resonator structure R, which are interconnected in series to an inductive element IE and not directly with the common terminal CC.

Figure 7:
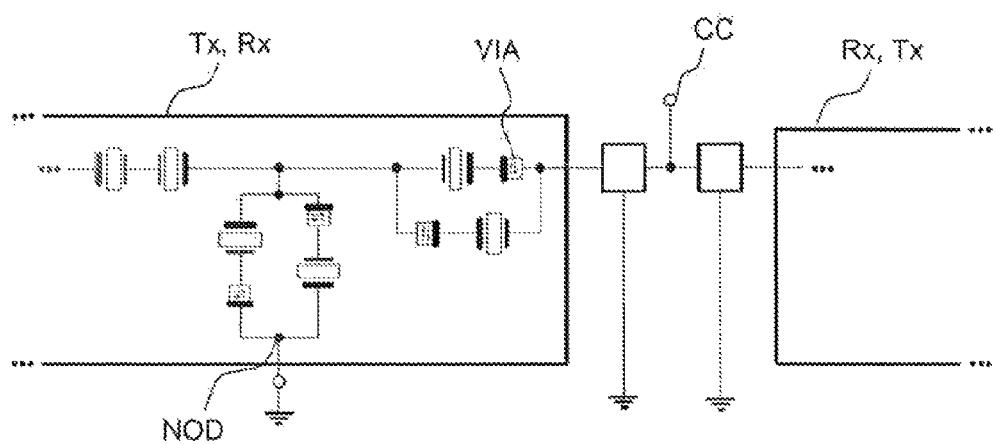
FIG. 7 shows a multiplexer having double-embodied resonators in a transmit or receive filter.

FIG. 7 shows an embodiment in which it is shown as an example on the basis of a filter, which can be the transmit filter Tx or the receive filter Rx, how doubled resonators represent a further feature for reducing intermodulation products. The doubling can be embodied in this case as a parallel doubling or as a serial doubling.

In the case of parallel doubling, through contacts VIA can interconnect lower and upper electrodes of doubled resonators. Interconnected electrodes of doubled resonators are shown thicker as examples in FIG. 7. Interconnected electrodes of doubled resonators can be connected to one another via node points (NOD), via which a mass terminal can also be produced, for example.

It is also possible that parallel doubled resonators are additionally embodied as doubled in series.

Figure 8:
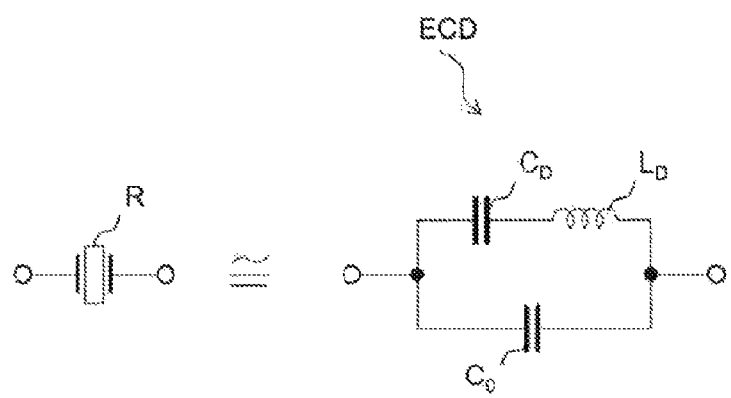
FIG. 8 shows the equivalent circuit diagram of an acoustic resonator.

FIG. 8 shows the equivalent circuit diagram ECD of an electroacoustic resonator R. The equivalent circuit diagram comprises in this case a static capacitance $C_0$ and, connected in parallel thereto, a series circuit made of a dynamic capacitance $C_D$ and a dynamic inductance $L_D$. At frequencies far away from the acoustic operating frequency, the resonator is essentially represented as a capacitive element having the static capacitance $C_0$. The dynamic capacitance $C_D$ and the dynamic inductance $L_D$ are essentially negligible. It behaves differently in the operating range of the resonator. The dynamic capacitance $C_D$ and the dynamic inductance $L_D$ then essentially control the behavior of the resonator, while the static capacitance $C_0$ plays a subordinate role.

Depending on the dimensioning of the electroacoustic resonator R and the definition of its operating range, a resonator may therefore be operated as a solely capacitive element or as a solely electroacoustic element or as a mixed form of both elements, so that a resonator can be adapted to operate as a filter element in the transmit filter or receive filter and simultaneously to function as a blocker element in the blocker path. In this case, essentially no other method steps are required for the production to provide the resonator R in the blocker path, so that the proposed multiplexer is producible without additional effort and can be used with known methods for reducing intermodulation effects.

Figure 9:
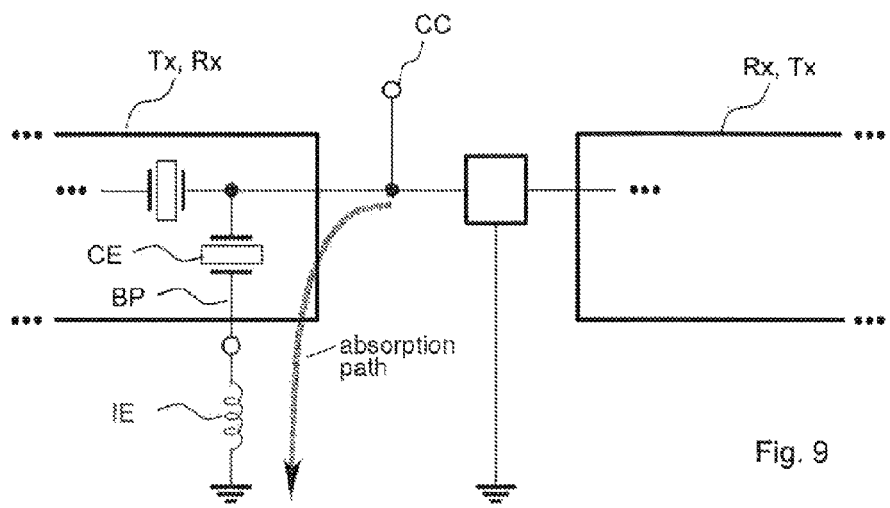
FIG. 9 shows a multiplexer having a parallel branch resonator in the blocker path of a transmit or receive filter.

FIG. 9 shows an embodiment of a multiplexer, wherein the blocker path comprises a parallel branch resonator of the transmit filter (Tx) or receive filter (Rx), in which the blocker electrodes CE are arranged. Furthermore, the blocker path comprises an inductive element IE, so that via the dimensioning of the electrodes CE and the inductive element IE, a signal path can be obtained, via which blocker signals can be intentionally diverted to ground.

Figure 10:
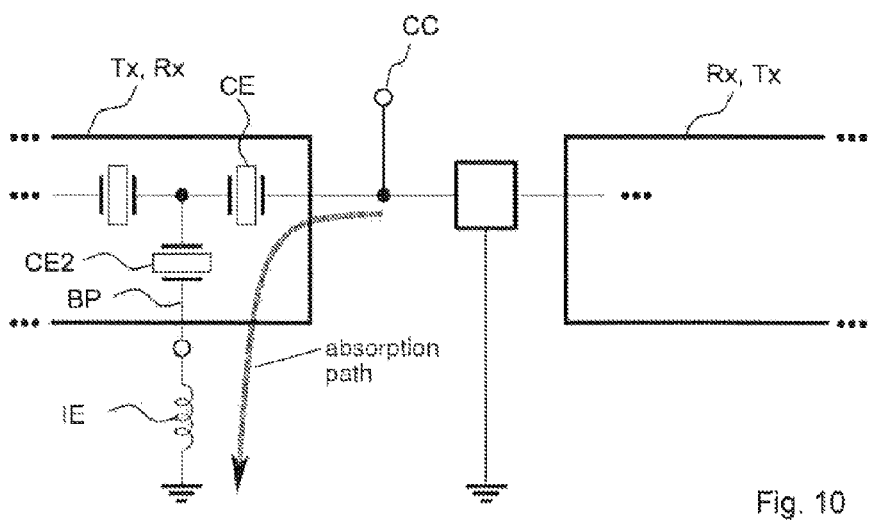
FIG. 10 shows a multiplexer having a series branch resonator and a parallel branch resonator in a transmit or receive filter.

FIG. 10 shows an embodiment of a multiplexer, in which the blocker path BP comprises a series branch resonator having blocker electrodes CE and a parallel branch resonator having blocker electrodes CE2 and also an inductive element IE. The corresponding electrode structures and the inductive element are selected similarly to the embodiment of FIG. 9, so that good diversion of blocker signals to ground is obtained.

Figure 11:
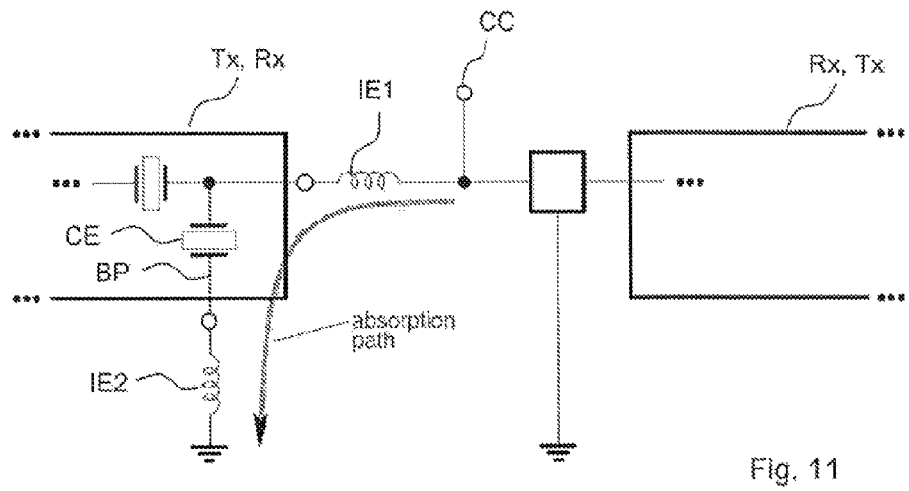
FIG. 11 shows a multiplexer having two inductive elements and an electroacoustic resonator in a blocker path.

FIG. 11 shows an embodiment of a multiplexer, in which the blocker path BP comprises a first inductive element IE1, a second inductive element IE2, and blocker electrodes, which are arranged in a resonator, of a capacitive element CE. The values of the inductances of the elements IE1 and IE2 and the value of the capacitance of the capacitive element CE in the blocker path BP are selected so that good diversion of blocker signals to ground is obtained.

Figure 12:
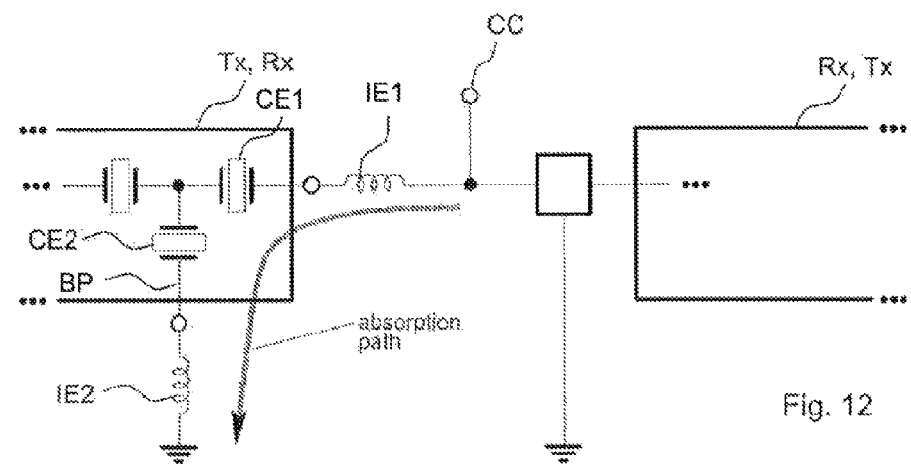
FIG. 12 shows a multiplexer having two inductive elements and two electroacoustic resonators in a blocker path, FIG. 13 schematically shows an embodiment in which a transmit filter is a notch filter, FIG. 14 schematically shows the use of a multiplexer in a mobile communication device having more than one antenna.

FIG. 12 shows an embodiment of a multiplexer, in which the blocker path BP comprises a first inductive element IE1, a second inductive element IE2, and blocker electrodes of a first capacitive element CE1 in a first resonator and further blocker electrodes in a second capacitive element CE2 in a parallel branch resonator. The values of the inductances and capacitances of the corresponding inductive and capacitive elements are selected accordingly to obtain good diversion of blocker signals to ground.

Figure 13:
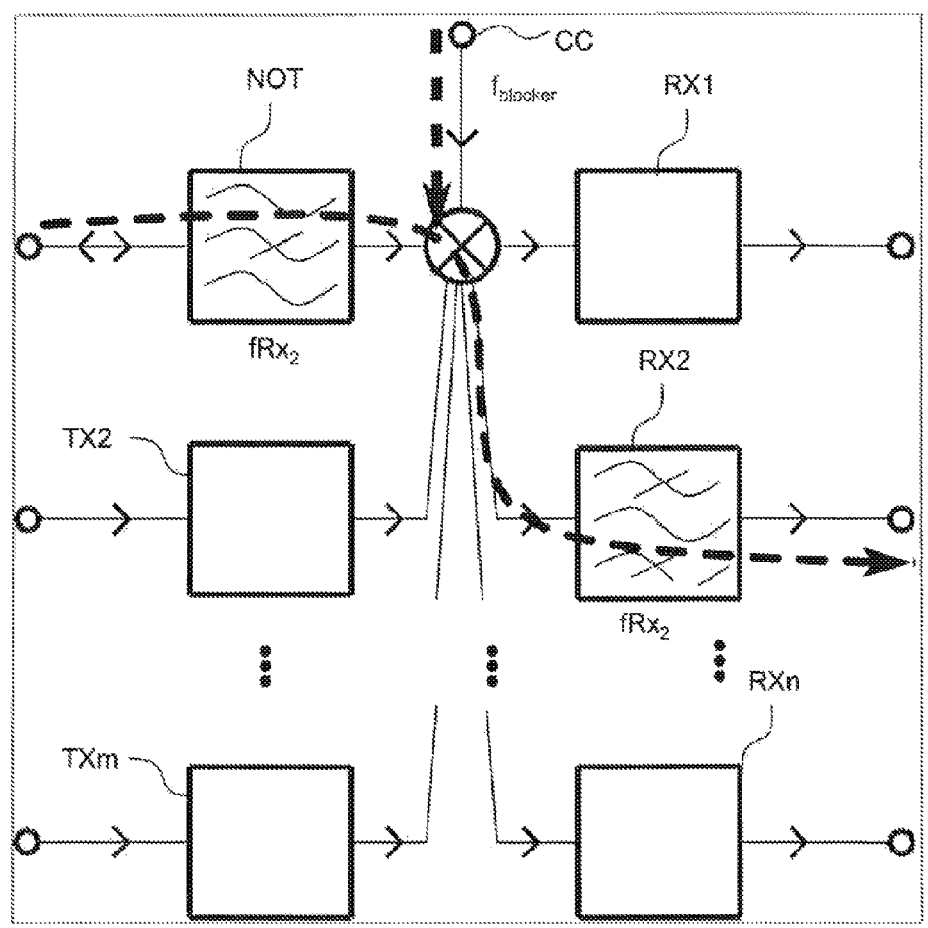

FIG. 13 shows, similarly to FIG. 3, a front-end circuit, in which a Tx filter was replaced by a band-stop NOT, which is non-transmissive for frequencies of an Rx filter Rx2. As an example, the critical case is shown in which transmit signals from the band-stop NOT are mixed with blocker frequencies $f_{blocker}$ at the common terminal CC and fall as interfering intermodulation products in the filter Rx2. Intermodulation products can also result which fall in another Rx filter. It also must be ensured here using blocker paths at the node CC that the blocker frequencies are eliminated.

It can thus be provided that, especially in receive paths for navigation data to be received from satellites, reception can take place undisturbed.

Figure 14:
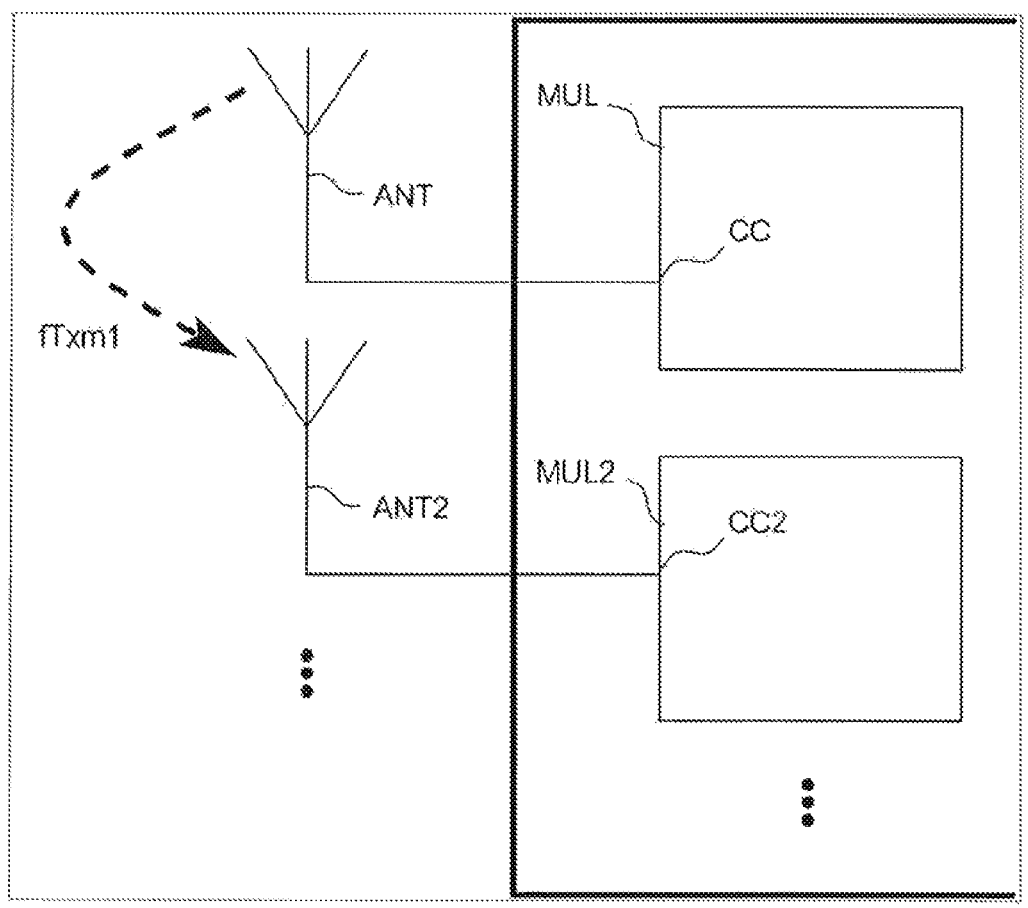

FIG. 14 schematically shows a mobile communication device having diversity functionality. I.e., in addition to an antenna ANT, a further antenna ANT2 exists, which fulfills additional transmit and/or receive tasks. Each of the antennas can be interconnected with a multiplexer MUL, MUL2. Blocker paths can now be provided in each of the multiplexers MUL, MUL2, to eliminate intermodulation products which can arise due to coupling of signals of one antenna into the other antenna. It is also possible that one of the multiplexers MUL, MUL2 comprises blocker paths to divert blocker signals to ground, which would interfere with the reception in the respective other multiplexer as intermodulation products.

Figure 15:
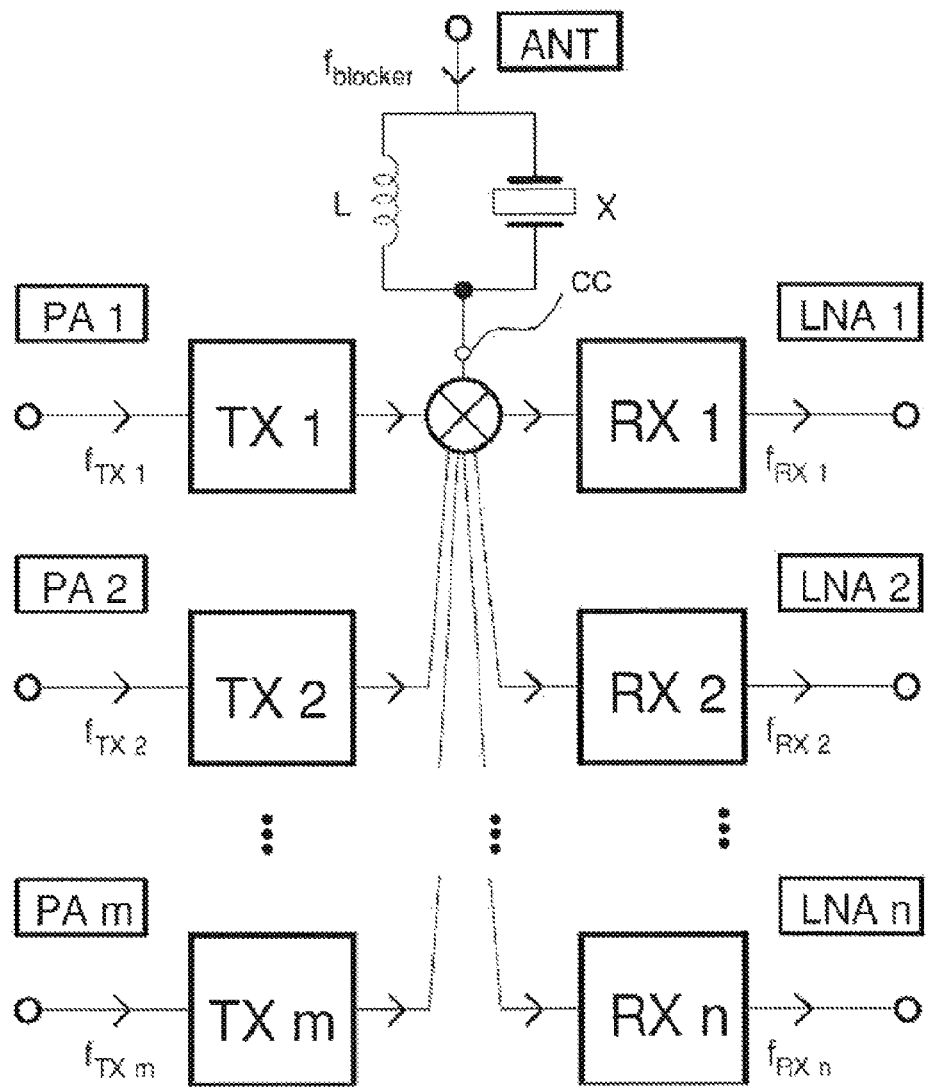
FIG. 15 shows an embodiment of a multiplexer, wherein a stop circuit made of an inductance L and an on-chip capacitance X is connected between an antenna terminal ANT and the common terminal CC.

FIG. 15 shows an embodiment of a multiplexer, wherein a stop circuit made of an inductance L and an on-chip capacitance X is interconnected between an antenna terminal ANT and the common terminal CC. The on-chip capacitance can be a resonator in this case or an on-chip element, which solely has a capacitive effect and is constructed like a resonator. If the on-chip capacitance X is a resonator, two stop frequencies thus exist, which are generated by the stop circuit.

Figure 16:
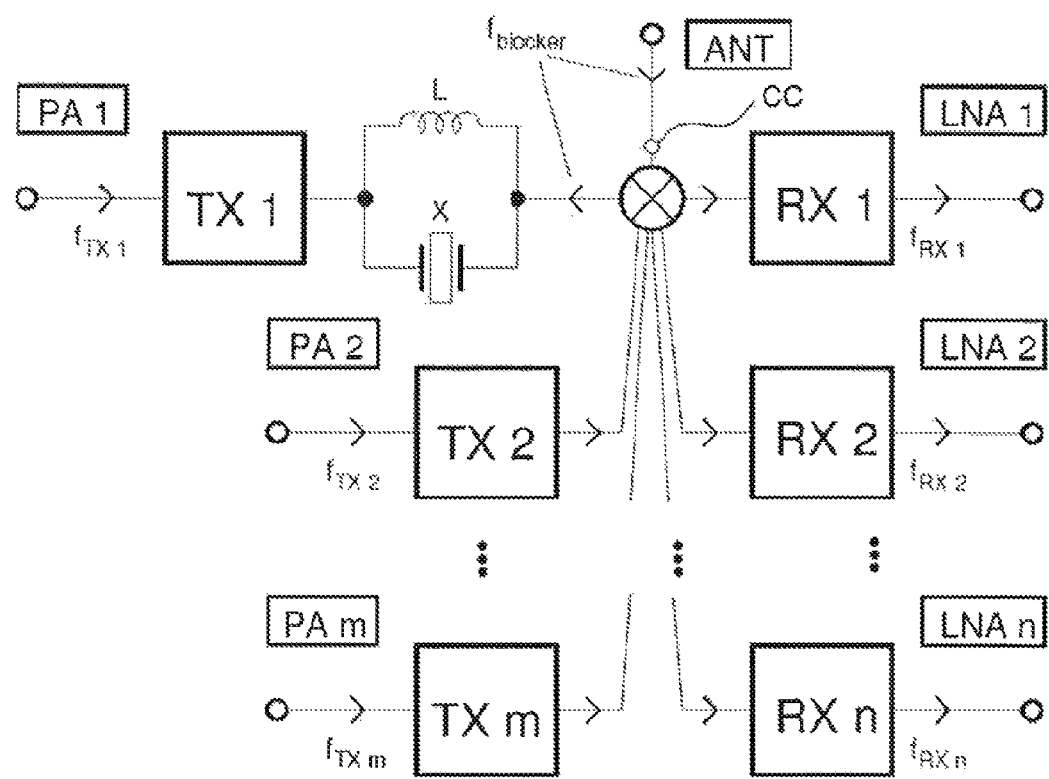
FIG. 16 shows an embodiment of a multiplexer having a stop circuit between the common terminal CC and a filter in the transmit path.

FIG. 16 shows a stop circuit between the common terminal CC and a filter in the transmit path. The stop circuit can also be arranged between the common terminal CC and a filter in the receive path. The stop circuit comprises an inductance L and an on-chip capacitance X. The on-chip capacitance X can again be a resonator or a chip element solely having a capacitive effect (cf. FIG. 15).

A multiplexer according to the invention is not restricted to one of the described exemplary embodiments. Combinations of the exemplary embodiments and variations which comprise, for example, still further inductive or capacitive elements in transmit filters, receive filters, or further circuit elements, also represent exemplary embodiments according to the invention.

LIST OF REFERENCE SIGNS

ANT, ANT2: antenna
BAWR: BAW resonator
BP: blocker path
C0: static capacitance
CC: common terminal
CC2: common terminal of the second multiplexer
CD: dynamic capacitance
CE: capacitive element
CE2: further capacitive element
CH: chip
ECD: equivalent circuit diagram
EFI: electrode finger
EL1, EL2: electrodes
$F_{blocker}$: blocker frequency
FRx2, FRx2, FRxn: receive frequencies
FTx1, FTx2, FTxM: transmit frequencies
FTxm1: signal coupled from one antenna into the other antenna, which is already an interfering intermodulation product or results in an interfering intermodulation product in the other antenna.
GND: ground
IDS: interdigital structure
IE: inductive element
IE2: further, second inductive element
LD: dynamic inductance
MN: adaptation network
MUL, MUL2: multiplexer, second, further multiplexer
NOD: node point
PL: dielectric layer
R: (electroacoustic) resonator
Rx: receive filter
Rx1, Rx2: receive filter
RxC, Rxn: receive terminal
RxC1, RxC2, RxCn: receive terminal
SAWR: SAW resonator
Tx: transmit filter
Tx1, Tx2, Txm: transmit filter
TxC: transmit terminal
TxC1, TxC2, TxCm: transmit terminal
VIA: through contact (via)

What is claimed is:

1. A multiplexer (MUL) which operates with acoustic waves, comprising:
    a transmit terminal (TxC), a receive terminal (RxC), and a common terminal (CC);
    a transmit path, which is interconnected between the transmit terminal (TxC) and the common terminal (CC) and comprises a transmit filter (Tx);
    a receive path, which is interconnected between the receive terminal (RxC) and the common terminal (CC) and comprises a receive filter (Rx);
    a chip (CH); and
    two or more blocker paths interconnected with the common terminal (CC) and comprising blocker electrodes (EL1, EL2) arranged on the chip (CH), which are provided to divert blocker signals to ground (GND), wherein:

at least one of the transmit filter (Tx) or the receive filter (Rx) has a bulk acoustic wave (BAW) resonator;

the two or more blocker paths have at least one BAW resonator; and at least one of the two or more blocker paths (BP) comprise one or more stop circuits for blocker frequencies, wherein the one or more stop circuits is interconnected between an antenna terminal and the common terminal (CC).

2. The multiplexer (MUL) of claim 1, wherein at least one of the two blocker paths (BP) comprise circuit elements of the transmit filter (Tx) or the receive filter (Rx).

3. The multiplexer (MUL) of claim 1, wherein each of two or more blocker paths or each of the at least one BAW resonator of the two or more blocker paths diverts two blocker frequencies.

4. The multiplexer (MUL) of claim 1, further comprising:
one or more further transmit paths each having a further transmit filter (Tx2, . . . , Txm); and
one or more further receive paths each having a further receive filter (Rx2, . . . , Rxn).

5. The multiplexer (MUL) of claim 1, wherein at least one of the transmit filter (Tx) or the receive filter (Rx) operates with surface acoustic waves, with bulk acoustic waves, or with guided bulk acoustic waves.

6. The multiplexer (MUL) of claim 5, wherein the transmit filter (Tx) comprises BAW resonators and the receive filter (Rx) comprises SAW resonators, and wherein the BAW resonators and the SAW resonators are arranged on or in various chips.

7. The multiplexer (MUL) of claim 1, wherein the chip (CH) comprises all circuit elements of at least one of the transmit filter (Tx) or the receive filter (Rx).

8. The multiplexer (MUL) of claim 1, wherein at least one of the two or more blocker paths (BP) comprise an inductive element (IE), which is embodied
as a metallization in the transmit filter (Tx) or in the receive filter (Rx) on the chip (CH),
as a metallization in a multilayer substrate, on which the chip (CH) is arranged,
as a discrete element on a module, which contains the chip (CH), or
as a discrete element on a circuit board, which is interconnected with the chip (CH).

9. The multiplexer (MUL) of claim 8, wherein the inductive element (IE) is a parasitic inductance of a feed line.

10. The multiplexer (MUL) of claim 1, wherein the at least one BAW resonator of the two or more blocker paths has more or fewer layers than one of resonators of at least one of the transmit filter (Tx) or the receive filter (Rx).

11. The multiplexer (MUL) of claim 1, wherein one or more layers of the at least one BAW resonator of the two or more blocker paths are different in thickness from the BAW resonator of the at least one of the transmit filter (Tx) or the receive filter (Rx).

12. The multiplexer (MUL) of claim 1, wherein a physical property of a layer of the at least one BAW resonator of the two or more block paths is different than physical properties of corresponding layers of the BAW resonator of the at least one of the transmit filter (Tx) or the receive filter (Rx).

13. The multiplexer (MUL) of claim 1, wherein a geometry of the at least one BAW resonator of the two or more block paths is different than a geometry of the BAW resonator of the at least one of the transmit filter (Tx) or receive filter (Rx).

14. The multiplexer (MUL) of claim 1, wherein a first blocker path of the two or more blocker paths (BP) is interconnected with a node arranged between the transmit filter (Tx) and the common terminal (CC), and a second blocker path of the two or more block paths is interconnected with a node arranged between the receive filter (Rx) and the common terminal (CC).

15. The multiplexer (MUL) of claim 1, comprising precisely one transmit filter (Tx) and precisely one receive filter (Rx).

16. The multiplexer (MUL) of claim 1, wherein the transmit filter or receive filter comprises band-pass filters or band-stop filters.

17. The multiplexer (MUL) of claim 1, wherein at least one of the two or more blocker paths (BP) comprises one or multiple stop circuits for blocker frequencies, wherein the one stop circuit or the multiple stop circuits are interconnected between the common terminal (CC) and the receive filter or the transmit filter.

18. The multiplexer (MUL) of claim 1, the transmit path having a band-stop filter, which is non-transmissive for blocker frequencies in relation to the receive path.

19. The multiplexer (MUL) of claim 18, wherein the transmit filter (Tx) is a bidirectional single filter.

20. The multiplexer (MUL) of claim 18, wherein the band-stop filter is a bidirectional single filter.

21. The multiplexer (MUL) of claim 18, wherein the transmit filter (Tx) or a further multiplexer follows the band-stop filter on a side facing away from an antenna.

22. The multiplexer (MUL) of claim 1, wherein the multiplexer (MUL) is contained in a mobile communication device having a further filter or multiplexer and having two antennas.

23. The multiplexer (MUL) of claim 22, wherein the further filter is a receive filter for GPS, Glonass, Galileo, or Compass signals.

24. A mobile communication device comprising:
a first multiplexer and one or more second multiplexers, each of the first and one or more second multiplexers according to claim 1; and
two or more antennas interconnected with the first and one or more second multiplexers.

25. The mobile communication device of claim 24, wherein the first multiplexer is configured to divert blocker signals from the one or more second the multiplexers.

26. The multiplexer (MUL) of claim 1, wherein a first or second order high-pass, a first or second order low-pass, a first or second order band-pass, or a first or second order band-stop filter is connected to at least one of the transmit or receive filter in the transmit and receive paths.

27. The multiplexer (MUL) of claim 26, wherein the at least one first or second order high-pass, a low-pass, a band-pass, or a band-stop filter is constructed from capacitive and/or inductive elements.

28. A multiplexer (MUL) which operates with acoustic waves, comprising:
a transmit terminal (TxC), a receive terminal (RxC), and a common terminal (CC);
a transmit path, which is interconnected between the transmit terminal (TxC) and the common terminal (CC) and comprises a transmit filter (Tx);
a receive path, which is interconnected between the receive terminal (RxC) and the common terminal (CC) and comprises a receive filter (Rx);
a chip (CH); and
a blocker path (BP), which is interconnected with the common terminal (CC), wherein the blocker path (BP) comprises blocker electrodes (EL1, EL2) arranged on the chip (CH), which are provided to divert blocker signals to ground (GND), and wherein the multiplexer (MUL) is contained in a mobile communication device having a further filter or multiplexer and having two antennas, and diverts blocker signals to ground, which are coupled from one antenna into the other antenna.

* * * * *